(12) United States Patent
Watanabe

(10) Patent No.: US 7,446,461 B2
(45) Date of Patent: Nov. 4, 2008

(54) TUNING FORK TYPE CRYSTAL OSCILLATOR WITH ANGULAR VELOCITY DETECTION CAPABILITY

(75) Inventor: Makoto Watanabe, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/506,865

(22) Filed: Aug. 21, 2006

(65) Prior Publication Data

US 2007/0040470 A1 Feb. 22, 2007

(30) Foreign Application Priority Data

Aug. 22, 2005 (JP) .............................. 2005-240428

(51) Int. Cl.
*H03H 9/21* (2006.01)

(52) U.S. Cl. .................................... 310/370; 73/504.02

(58) Field of Classification Search ................. 310/370
See application file for complete search history.

(56) References Cited

U.S. PATENT DOCUMENTS

2005/0160813 A1* 7/2005 Imai ........................ 73/504.12

FOREIGN PATENT DOCUMENTS

| JP | 2001292367 A | * | 10/2001 |
| JP | 2004045440 A | * | 2/2004 |

* cited by examiner

*Primary Examiner*—Jaydi A San Martin
(74) *Attorney, Agent, or Firm*—Fitch, Even, Tabin & Flannery

(57) ABSTRACT

A crystal oscillator used as a clock source and further having an angular velocity detection capability is provided with: a tuning fork type crystal unit provided with excitation electrodes for exciting tuning fork vibration and sensing electrodes for detecting electric charge generated by the Coriolis force; an oscillation circuit connected to the excitation electrodes for both exciting the tuning fork vibration and for supplying a clock signal as output based on the tuning fork vibration; and a detection circuit connected to the sensing electrodes for supplying an angular velocity signal in accordance with the electric charge. The tuning fork crystal unit has first and second tuning fork arms for realizing the tuning fork vibration. The excitation electrodes are provided on the side surfaces of the first tuning fork arm and the sensing electrodes are provided on the side surfaces of the second tuning fork arm.

8 Claims, 5 Drawing Sheets

US 7,446,461 B2

TUNING FORK TYPE CRYSTAL OSCILLATOR WITH ANGULAR VELOCITY DETECTION CAPABILITY

This Application is a U.S. Utility Patent Application which claims priority from Japanese Application No. JP 2005-240428, filed Aug. 22, 2005, the complete disclosure of which is incorporated herein by reference.

BACKGROUND OF THE INVENTION

1. Field of the Invention

The present invention relates to a quartz crystal oscillator provided with a tuning fork type quartz crystal unit, and more particularly to a tuning fork type crystal oscillator that can be used as a clock source, and further, that has an angular velocity detection capability.

2. Description of the Related Art

A tuning fork type crystal oscillator in which a tuning fork type crystal unit and an oscillation circuit that uses this crystal unit are integrated is used as a clock source for generating a reference clock signal in equipment such as a portable telephone. The clock frequency generated by a tuning fork type crystal oscillator is typically 32.768 KHz or 16.384 KHz. In addition to being incorporated in an oscillation circuit and used as a clock source, a tuning fork type crystal unit is also provided with the application of an angular velocity sensor.

In portable telephones, the incorporation of a camera function (i.e., imaging function) as a part of the increased functionality of these devices has become a standard feature. However, portable telephones with this camera function are light in weight and therefore particularly prone to camera shake when the shutter is operated when the camera function is used to take pictures. According to a known technology typically employed in digital cameras or the like, the angular velocity of the camera when taking a picture is measured and the effect of camera shake on the captured image then corrected based on the measured angular velocity. Correction of camera shake can also be implemented in a portable telephone having a camera function by sensing the angular velocity of the portable telephone when taking a picture, and the correction of camera shake by providing an angular velocity sensor that uses a tuning fork type crystal unit can be considered.

FIG. 1 shows the configuration of a conventional portable telephone that is provided with a camera function. This portable telephone is equipped with communication structure 2 for executing communication operations as a portable telephone and camera structure 3 for capturing images. Tuning fork type crystal oscillator 4 is further provided, this tuning fork type crystal oscillator 4 being composed of tuning fork type crystal unit 5 and oscillation circuit 6 that uses this tuning fork type crystal unit 5. Tuning fork type crystal unit 5 is a component having an oscillation frequency of, for example, 32.768 KHz, and oscillation circuit 6 supplies a clock frequency of 32.768 KHz.

Communication structure 2 is controlled by synchronizing to the clock frequency supplied from tuning fork type crystal oscillator 4. Communication structure 2 is connected to antenna 2A and performs transmission to and reception from a base station or the like by way of antenna 2A.

As is well known in the art, three crystallographic axes X, Y, and Z are defined in a quartz crystal. A tuning fork type crystal unit is obtained by cutting a crystal blank in a tuning fork shape from a single crystal of quartz, this crystal blank having a pair of tuning fork arms 7a and 7b and tuning fork base 7c, as shown in FIG. 2A. In this case, a Z-cut wafer in which the principal plane is orthogonal to the Z-axis is used, and the tuning fork type crystal unit is cut from the Z-cut wafer such that the X-axis is the direction of width, the Y-axis is the direction of length, and the Z-axis is the direction of thickness. The horizontal direction shown in the figure is the X-axis direction, and the tuning fork type crystal unit is formed such that the pair of tuning fork arms 7a and 7b each extend in the Y-axis direction from the two ends in the X-direction of tuning fork base 7c. Tuning fork arms 7a and 7b are both shaped as square shafts, and excitation electrodes 8 are formed on each of the four side surfaces of each arm as shown in FIG. 2B.

Regarding excitation electrodes 8 of each tuning fork arm 7a and 7b when this type of tuning fork type crystal unit 5 is excited, the same potential is applied to a pair of opposite excitation electrodes 8 that sandwich the tuning fork arm, and the opposite voltage is applied to the adjacent excitation electrodes 8. At this time, if a negative potential is applied to the two principal planes (of the Z-cut wafer) and a positive potential is applied to the two side planes on one tuning fork arm 7a, a positive potential is applied to the two principal planes and a negative potential is applied to the two side planes on the other tuning fork arm 7b. Crystal unit 5 is provided with a pair of terminals, and lead electrodes (not shown) are provided such that voltage of the same potential and of the opposite potential is applied from the pair of terminals to each excitation electrode 8. The "+" and "−" marks of FIG. 2B show how voltage is to be applied to each of excitation electrodes 8. In FIG. 2B, excitation electrodes 8 marked by "+" are connected in common to one terminal, and excitation electrodes 8 marked by "−" are connected in common to the other terminal.

Next, regarding the operation of this tuning fork type crystal unit, when positive potential and negative potential are applied to excitation electrodes 8 as shown in FIG. 2B, an electric field is produced that is directed from the two side surfaces and toward the two principal surfaces of the Z-cut wafer in one tuning fork arm 7a, and an electric field is produced that is directed from the two principal surfaces and toward the two side surfaces of the Z-cut wafer in the other tuning fork arm 7b, as indicated by the arrows in the figure. In other words, electric fields are produced between the two principal surfaces and two side surfaces are mutually opposed between tuning fork arms 7a and 7b. The Z-cut wafer expands in the Y-axis direction when the electric field component directed in the +X-axis direction is applied, and contracts in the Y-axis direction when a field component toward the −X-axis direction is applied, whereby tuning fork arms 7a and 7b expand in the Y-axis direction on the outer side surface portions of each arm and contract in the Y-axis direction on the inner side surface portions. If the polarity of the potential that is applied to each of excitation electrodes 8 is then reversed, the outer side surface portions of each of tuning fork arms 7a and 7b now contract in the Y-axis direction, and the inner side surface portions expand in the Y-axis direction. By producing this X-Y flexure vibration, the pair of tuning fork arms 7a and 7b generate tuning fork vibration in the horizontal direction in the figure.

Explanation next regards an oscillation circuit that uses this type of tuning fork crystal type unit with reference to FIG. 3. Oscillation circuit 6 is provided with amplifier 8 for oscillation, and a pair of split capacitors 9a and 9b. Amplifier 8 is provided as an inverter amplification element that is provided with feedback resistor 10; and the input end and output end of amplifier 8 are connected to the pair of terminals of tuning fork type crystal unit 5, respectively. Split capacitors 9a and 9b, together with tuning fork type crystal unit 5 as the inductive component, form a resonance circuit, and are each provided between ground and a respective terminal of the pair of terminals of tuning fork type crystal unit 5.

The portion of this oscillation circuit 6 other than crystal unit 5 are provided and integrated in an IC (integrated circuit) chip. After the introduction of the power supply of portable telephone 1, this oscillation circuit constantly generates a clock frequency (for example, 32.768 KHz) to supply oscillation output fout to communication structure 2. The clock frequency is proportional to $W/L^2$, where W is the width and L is the length of the tuning fork arms in tuning fork crystal unit 5.

Explanation next regards camera structure 3. Camera structure 3 is activated by a switch that is separate from the power supply of portable telephone 1, receives angular velocity information from angular velocity sensing mechanism (i.e., angular velocity sensor) 11 for correcting camera shake, and based on this angular velocity information, corrects camera shake when a picture is taken. Angular velocity sensing mechanism 11 is composed of angular velocity sensing element 12, oscillation circuit 6, and detection circuit 13. As shown in FIG. 4, angular velocity sensing element 12 is provided with a tuning fork type crystal blank similar to the previously described tuning fork type crystal unit 5, and excitation electrodes 8 and sensing electrodes 14 that are provided on the side surfaces of the tuning fork arms.

Excitation electrodes 8 are provided on only one tuning fork arm such that the excitation electrodes are disposed on four side surfaces of this tuning fork arm 7a. As in the case shown in FIG. 2B, the same potential is then applied to a pair of opposite excitation electrodes 8 that sandwich tuning fork arm 7a, and the opposite voltage is applied to adjacent excitation electrodes 8. Excitation electrodes 8 on the two side surfaces (of the Z-cut wafer) are connected in common and taken as the first terminal, and excitation electrodes 8 on the two principal surfaces (of the Z-cut wafer) are connected in common and taken as the second terminal, and these first and second terminals are connected to oscillation circuit 6. In this angular velocity sensing element 12, tuning fork arm 7a exhibits flexure vibration when oscillation circuit 6 is put into operation, but tuning fork arm 7b resonates with tuning fork arm 7a and then begins flexure vibration, the entirety of tuning fork arms 7a and 7b thus exhibiting tuning fork vibration. The oscillation frequency in this case is assumed to be approximately 17 KHz, for example.

Two sensing electrodes 14 are provided aligned in the direction of the Y-axis on, of the four side surfaces of tuning fork arm 7b, the two surfaces that are the side surfaces of the Z-cut wafer, i.e., the surface directed in the +X direction and the surface directed in the −X direction. Here, the two sensing electrodes 14 that are provided on each of the pair of side surfaces of tuning fork arm 7b are arranged to confront sensing electrodes 14 on the other side surface with tuning fork arm 7b interposed.

When element 12 rotates with the Y-axis as the center when tuning fork arms 7a and 7b are exhibiting tuning fork oscillation in angular velocity sensing element 12 of this configuration, the Coriolis force acts such that tuning fork arms 7a and 7b exhibit vibration in mutually opposing directions in the up and down directions in the figure with one of tuning fork arms 7a and 7b displaced in the +Y-axis direction and the other displaced in the −Y-axis direction, i.e., such that tuning fork arms 7a and 7b generate X-Z flexure vibration. As a result, electric fields are produced in the X-axis direction at tuning fork arm 7b as shown by the straight arrows in FIG. 4. These electric fields in the X-axis direction are mutually opposing fields at positions close to one principal surface and positions close to the other principal surface of the Z-cut wafer. Electric charge occurs as represented by the "+" and "−" marks shown in the figure in the side surfaces on which sensing electrodes 14 of tuning fork arm 7b are formed, and this charge is detected by sensing electrodes 14. The magnitude of this charge obviously changes in accordance with the magnitude of the angular velocity received by angular velocity sensing element 12. By means of the detection of this charge in detection circuit 13, the angular velocity received by angular velocity sensing element 12 can be determined. Angular velocity signal Sout that corresponds to the detected angular velocity is then supplied as output from detection circuit 13.

An electric field produced by the Coriolis force also occurs in tuning fork arm 7a on which excitation electrodes 8 are provided and an electric charge is produced by this electric field, but the provision of excitation electrodes 8 that cover substantially the entire surface of each side surface of tuning fork arm 7a cancels out the charge produced by the Coriolis force. Accordingly, the influence of the Coriolis force does not reach oscillation circuit 6.

In this angular velocity sensing mechanism 11, a configuration similar to the form described using FIG. 3 is used as oscillation circuit 6. Detection circuit 13 includes a charge amplifier for amplifying the charge that is detected at sensing electrodes 14 and a synchronous detection circuit for carrying out signal processing synchronized to the tuning fork oscillation. Oscillation circuit 6 and detection circuit 13 are integrated as a single unit in IC chip 15, as indicated by the surrounding broken line in FIG. 4.

In a conventional portable telephone such as shown in FIG. 1, tuning fork type crystal oscillator 4 as described hereinabove and angular velocity sensing mechanism 11 are each accommodated in separate surface-mount receptacles and separately packaged and mounted as discrete parts.

Angular velocity sensing mechanism 11 for realizing camera-shake compensation in a camera is provided in a portable telephone of the above-described configuration, but tuning fork type crystal oscillator 4 for use as the reference clock source in the portable telephone and angular velocity sensing mechanism 11 for use in camera-shake compensation both require a tuning fork type crystal unit and an oscillation circuit, and the inclusion of these component interferes with miniaturization of the portable telephone. In addition, the tuning fork type crystal oscillator and angular velocity sensing mechanism, both being separate and discrete parts, raise the problem of an increase in the number of parts.

SUMMARY OF THE INVENTION

It is an object of the present invention to provide a tuning fork type crystal oscillator that is used as a reference clock source and that further has an angular velocity detection capability.

The object of the present invention is attained by a crystal oscillator that is used as a clock source, and further, that has an angular velocity detection capability, this crystal oscillator being provided with: a tuning fork crystal unit provided with excitation electrodes for exciting tuning fork vibration of the crystal unit and sensing electrodes for detecting electric charge generated in the crystal unit by the Coriolis force; an oscillation circuit connected to the excitation electrodes for both exciting the tuning fork vibration and for supplying a clock signal output based on the tuning fork vibration; and a detection circuit connected to the sensing electrodes for supplying an angular velocity signal according to the electric charge.

The crystal oscillator according to the present invention uses a tuning fork crystal unit, which is used as an angular velocity sensing element, as a tuning fork crystal unit for a reference clock source, and obtains a clock frequency signal as a reference clock from the oscillation circuit for exciting the tuning fork vibration for measuring the angular velocity. Accordingly, the number of tuning fork crystal oscillators and oscillation circuits can each be reduced by one-half compared to a case in which a tuning fork crystal oscillator as the clock source and an angular velocity sensing structure are separately provided. The use of a tuning fork crystal oscillator having an angular velocity detection capability according to the present invention can facilitate the downsizing of electronic equipment that requires a clock source and an angular velocity sensing structure.

In such a crystal oscillator, the tuning fork crystal unit is constituted by, for example, a crystal blank that has been cut from a Z-cut wafer of quartz, and includes a tuning fork base and a first and second tuning fork arms extending in the same direction from the tuning fork base for realizing the tuning fork vibration. The excitation electrodes are provided on side surfaces of, for example, the first tuning fork arm, and the sensing electrodes are provided on side surfaces of, for example, the second tuning fork arm.

In the present invention, the detection circuit may be of a configuration for starting operation in accordance with a standby signal to supply the angular velocity signal.

Further, in the crystal oscillator according to the present invention, an IC chip for integrating the oscillation circuit and the detection circuit as a single unit and a surface-mount receptacle for accommodating the IC chip and the tuning fork crystal unit may be further provided, and at least an output terminal for the clock signal, an input terminal for the standby signal, and an output terminal for the angular velocity signal may be provided on the outer bottom surface of the surface-mount receptacle. This configuration enables the attainment of further miniaturization of the crystal oscillator.

In the present invention, the frequency of the clock signal is preferably 32.768 KHz or 16.384 KHz. The selection of these frequencies further allows use as the frequency for a timepiece and enables use as a typical clock source in an apparatus such as a portable telephone.

DETAILED DESCRIPTION OF THE PREFERRED EMBODIMENTS

Figure 1:
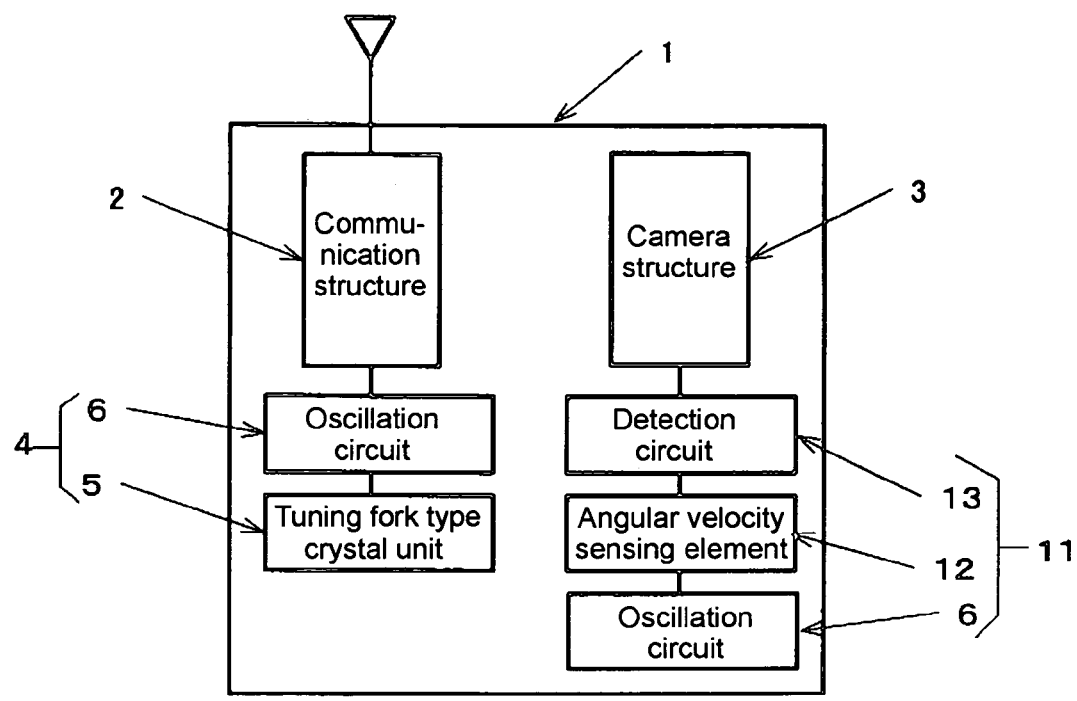
FIG. 1 is a schematic block diagram showing the configuration of a conventional portable telephone provided with a camera function.
Figure 2A:
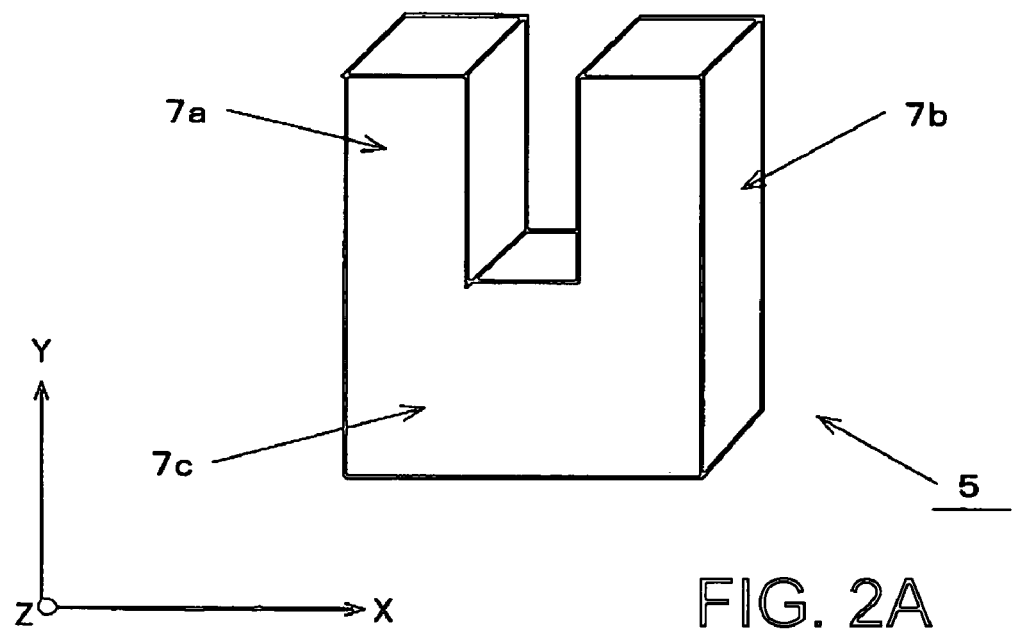
FIG. 2A is a perspective view of a crystal blank used in a conventional tuning fork crystal unit.
Figure 2B:
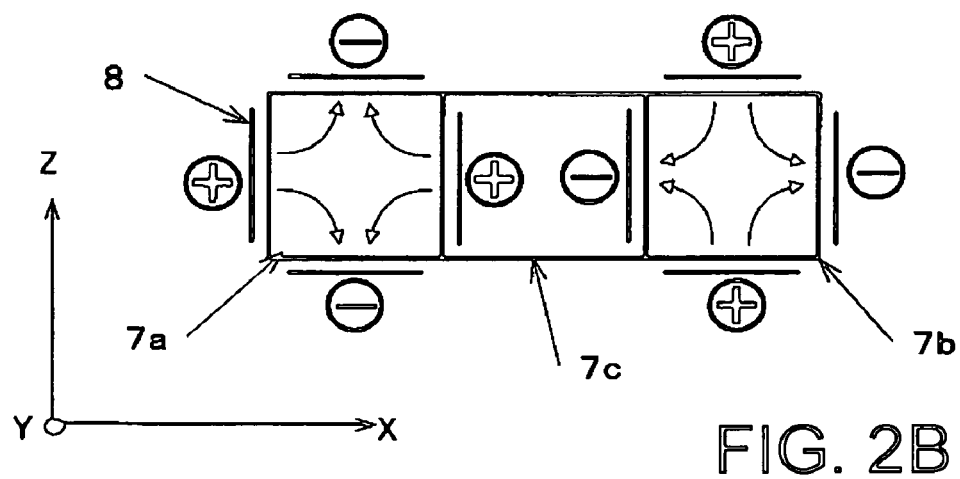
FIG. 2B is a front view showing the arrangement of electrodes in the conventional tuning fork crystal unit.
Figure 3:
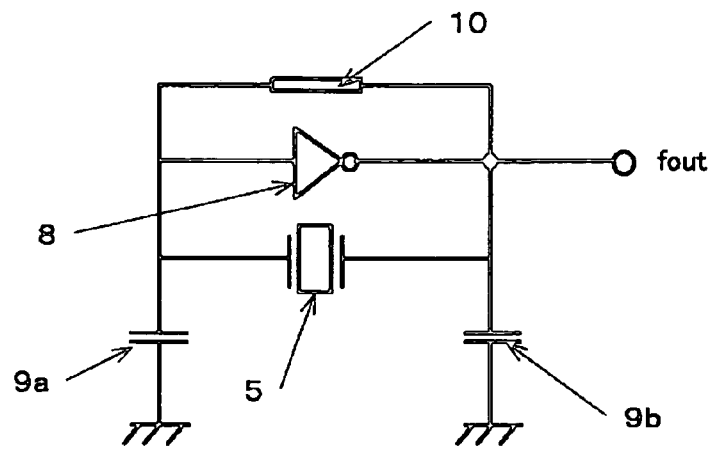
FIG. 3 is a circuit diagram showing an example of an oscillation circuit that uses a crystal unit.
Figure 4:
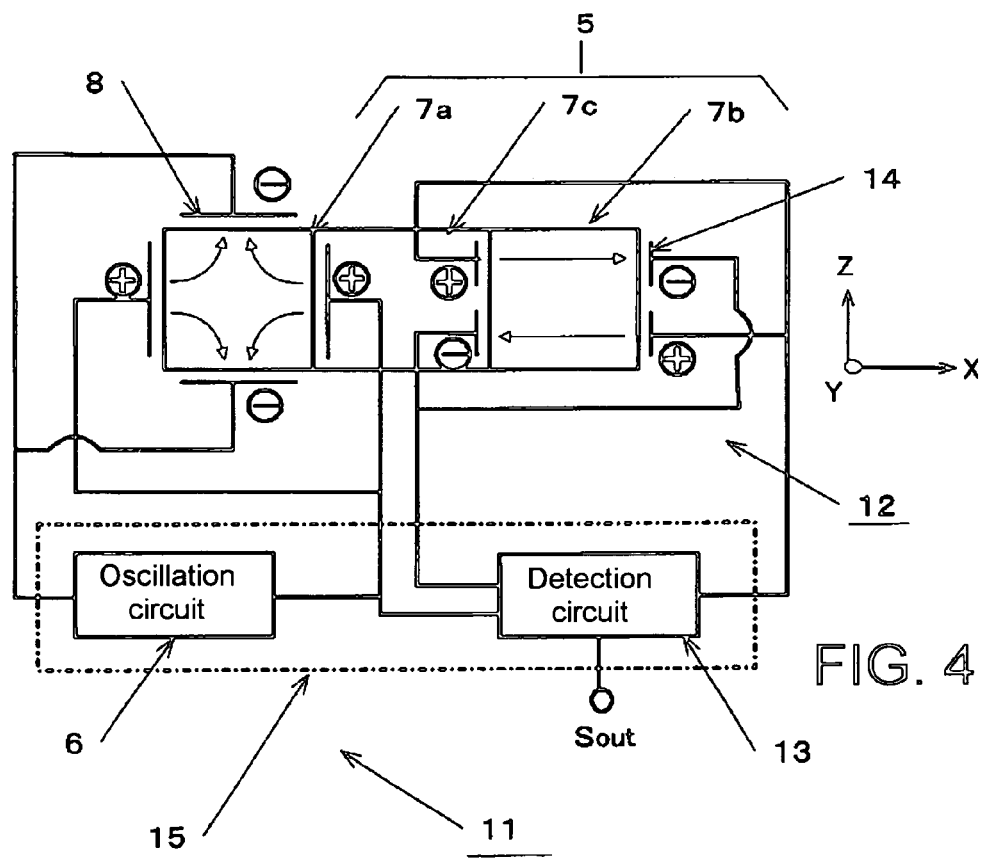
FIG. 4 is a view showing an angular velocity sensing element realized by a tuning fork crystal unit and an angular velocity sensing structure that uses this angular velocity sensing element.
Figure 5:
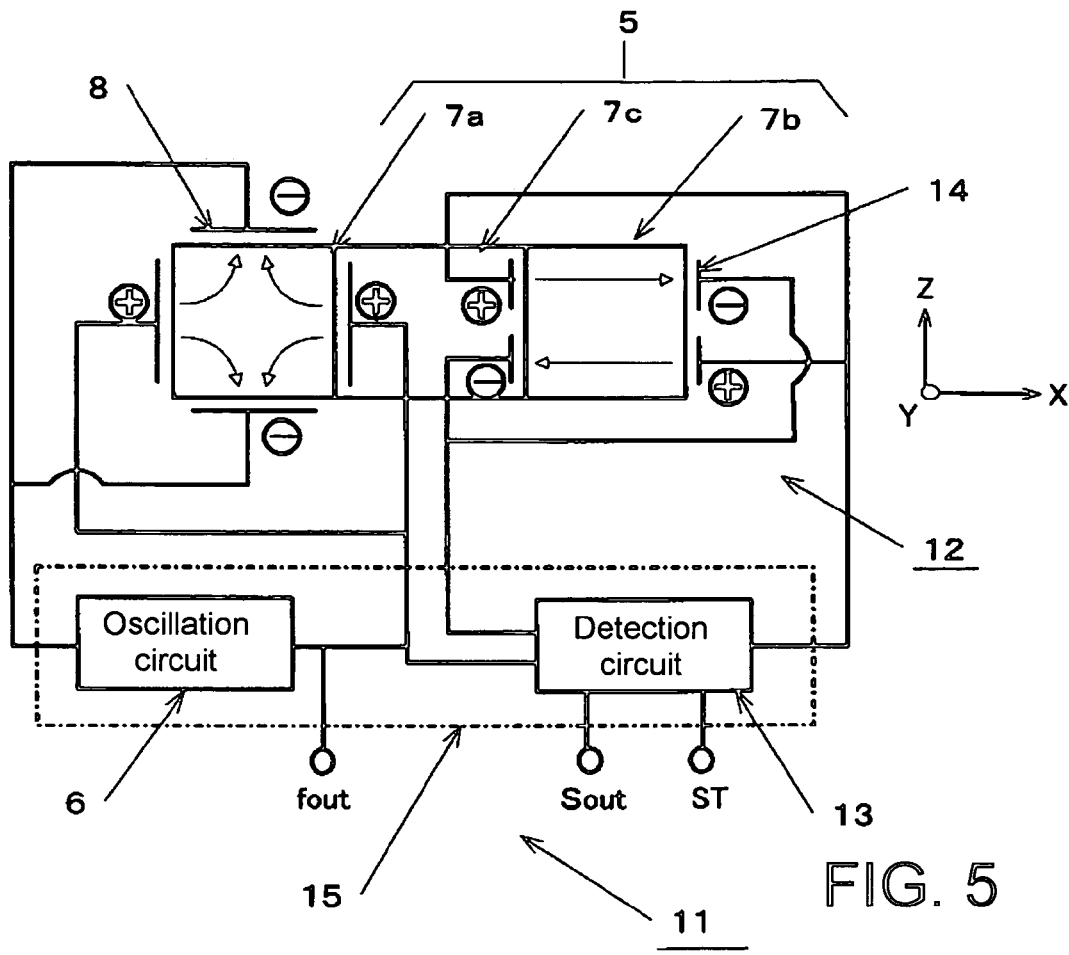
FIG. 5 is a schematic block diagram of a tuning fork crystal oscillator having an angular velocity detection capability according to an embodiment of the present invention.

FIG. 5 shows a tuning fork crystal oscillator according to an embodiment of the present invention. This tuning fork crystal oscillator can be used as a reference clock source in an apparatus such as a portable telephone and is further provided with an angular velocity detection capability. In FIG. 5, constituent elements identical to those elements shown in FIGS. 1 to 4 are given the same reference numerals, and redundant explanation is here omitted.

The tuning fork crystal oscillator according to the present embodiment is a device in which a tuning fork crystal unit, an oscillation circuit, and a detection circuit for detecting angular velocity are integrated as a single unit, and uses as the tuning fork crystal unit, i.e., tuning fork crystal blank, the element that was described as angular velocity sensing element 12 in FIG. 4. As previously described, in angular velocity sensing element 12, excitation electrodes 8 are provided on one tuning fork arm 7a of tuning fork crystal unit 5, i.e., a tuning fork crystal blank, and sensing electrodes 14 are provided on the other tuning fork arm 7b. Oscillation circuit 6 for exciting the tuning fork vibration in the crystal unit is connected to excitation electrodes 8, and a signal in which oscillation frequency fo, which is used as the reference clock source, is obtained as oscillation output fout from this oscillation circuit. The oscillation frequency fo is, for example, 32.768 KHz or 16.384 KHz.

Sensing electrodes 14 are connected to detection circuit 13. As in the device described hereinabove, detection circuit 13 includes a charge amplifier for amplifying a detected electric charge and a synchronous detection circuit for implementing signal processing synchronized with the tuning fork vibration. In the case of the present embodiment, oscillation output fout is of course synchronized with the tuning fork vibration, and the oscillation output fout is therefore conferred to the synchronous detection circuit. Detection circuit 13 supplies an angular velocity signal Sout that corresponds to the detected angular velocity. Detection circuit 13 operates in accordance with the standby signal ST that is supplied from the outside. In other words, the clock frequency signal fo from oscillation circuit 6 that is realized by tuning fork vibration is always supplied as output, but the angular velocity signal Sout is generated only when the standby signal ST is received as input. Other than angular velocity sensing element 12, oscillation circuit 6 and detection circuit 13 are integrated as a single unit in IC chip 15 as indicated by the broken-line box in FIG. 5.

Figure 6:
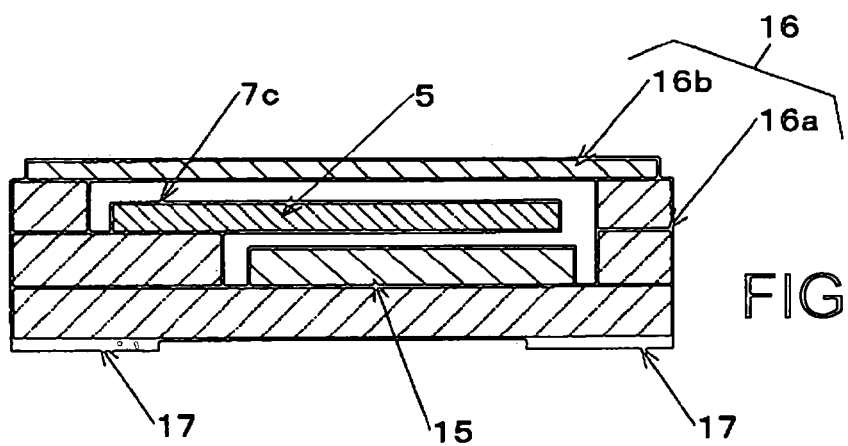
FIG. 6 is a sectional view of the tuning fork crystal oscillator having an angular velocity detection capability shown in FIG. 5.

FIG. 6 shows the sectional configuration of the tuning fork crystal oscillator according to the present embodiment. Angular velocity sensing element 12, which also functions as the crystal unit for the reference clock source, and IC chip 15 are accommodated as a single unit in surface-mount receptacle 16, thus forming the crystal oscillator. Surface-mount receptacle 16 is composed of, for example, laminated ceramics, and is made up from receptacle main body 16a having a cavity, and cover 16b for closing the cavity. A step is provided in the inner side wall of the cavity in receptacle main body 16a. IC chip 15 is secured to the bottom surface in the cavity, and tuning fork angular velocity sensing element 12, i.e., the tuning fork crystal unit, is held within the cavity by securing tuning fork base 7c of the tuning fork crystal unit to the upper surface of the step. After IC chip 15 and angular velocity sensing element 12 have been thus fixed, cover 16 is placed over the cavity to hermetically seal IC chip 15 and the tuning fork crystal unit within the cavity. IC chip 15 and the tuning fork crystal unit are electrically connected by a conductive pattern (not shown) formed on the inner walls of the cavity.

Surface-mount receptacle 16 is surface-mounted to a wiring board or a circuit board in, for example, a portable telephone. A plurality of external terminals 17 are formed on the outer bottom surface of receptacle main body 16a for electrical connection and mounting to the wiring board. External terminals 17 electrically connect to IC chip 15 by way of through-holes or conductive patterns (not shown) that are provided on receptacle main body 16a. At least an output terminal for the clock signal of oscillation frequency (clock frequency) fo, an input terminal for standby signal ST, and an output terminal for angular velocity signal Sout are provided as external terminals 17. In addition to these terminals, a power supply terminal and a ground terminal that are necessary for the operation of the tuning fork crystal oscillator may of course be provided as external terminals 17.

In such a tuning fork crystal oscillator, the oscillation frequency fo of oscillation circuit 6 for driving the tuning fork vibration of angular velocity sensing element 12 is taken as the clock source, whereby the number of crystal units can be reduced by half compared to a case in which the tuning fork crystal oscillator for the clock source is provided separately from the angular velocity sensing structure. This tuning fork crystal oscillator can therefore achieve a downsizing of an electronic apparatus that requires angular velocity detection. In particular, the crystal oscillator according to the present embodiment is constructed as an element for surface mounting and can therefore contribute to the further downsizing of an electronic apparatus.

Figure 7:
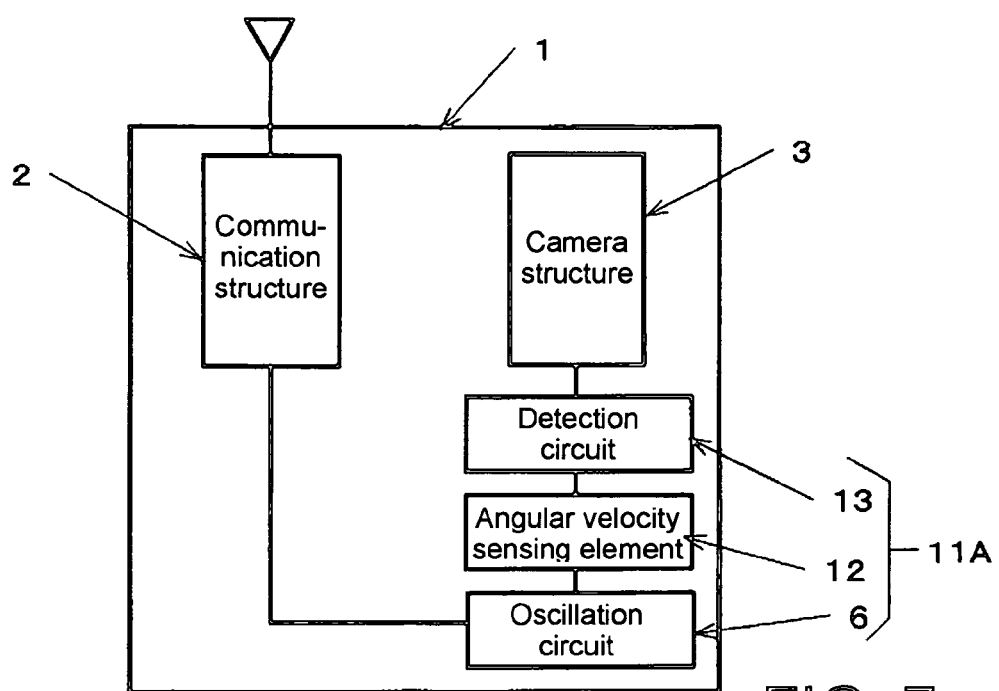
FIG. 7 is a schematic block diagram showing the configuration of a portable telephone that includes the tuning fork crystal oscillator having an angular velocity detection capability according to the present invention.

FIG. 7 shows the configuration of a portable telephone when the above-described tuning fork crystal oscillator is applied to a portable telephone having a camera function.

As with a conventional portable telephone, portable telephone 1 is provided with communication structure 2 and camera structure 3. Communication structure 2 and camera structure 3 are provided with only crystal oscillator 11A having the angular velocity detection capability of the present embodiment. Communication structure 2 is supplied with oscillation output fout from crystal oscillator 11A as the clock frequency. In addition, camera structure 3 is supplied with angular velocity signal Sout from crystal oscillator 11A in accordance with standby signal ST.

Although a tuning fork crystal oscillator with angular velocity detection capability according to a preferable embodiment of the present invention has been here described in which excitation electrodes 8 are provided on one tuning fork arm 7a of angular velocity sensing element 12 and sensing electrodes 14 are arranged on the other tuning fork arm 7b, the configuration of the angular velocity sensing element is not limited to this form. The arrangement of the excitation electrodes and sensing electrodes may differ from the form described hereinabove, and electrodes other than the excitation electrodes and sensing electrodes may be provided on the tuning fork crystal blank. In other words, any type of crystal unit can be used as long as the crystal unit is a tuning fork crystal unit in which tuning fork vibration is excited and that is provided with excitation electrodes for exciting the tuning fork vibration and sensing electrodes for detecting electric charge induced by the Coriolis force in the crystal unit.

The tuning fork crystal oscillator with angular velocity detection capability according to the present invention is not limited to use in a portable telephone having a camera function, but can be applied to other apparatus that require a clock source and angular velocity detection.

What is claimed is:

1. A crystal oscillator used as a clock source having an angular velocity detection capability, comprising:
    a tuning fork type crystal unit provided with excitation electrodes for exciting tuning fork vibration of the crystal unit and sensing electrodes for detecting electric charge generated in the crystal unit by the Coriolis force;
    an oscillation circuit connected to said excitation electrodes for both exciting said tuning fork vibration and for supplying a clock signal as output based on said tuning fork vibration;
    a detection circuit connected to said sensing electrodes for supplying an angular velocity signal in accordance with said electric charge, wherein said detection circuit starts operation in accordance with a standby signal to supply said angular velocity signal as output;
    an IC chip for integrating said oscillation circuit and said detection circuit as a single unit; and
    a surface-mount receptacle for accommodating said IC chip and said tuning fork crystal unit, wherein at least an output terminal for said clock signal, an input terminal for said standby signal, and an output terminal for said angular velocity signal are provided on the outer bottom surface of said surface-mount receptacle.

2. The crystal oscillator according to claim 1, wherein:
    said tuning fork type crystal unit includes a tuning fork base, and first and second tuning fork arms extend in the same direction from said tuning fork base for realizing the tuning fork vibration;
    said excitation electrodes are provided on side surfaces of said first tuning fork arm; and
    said sensing electrodes are provided on side surfaces of said second tuning fork arm.

3. The crystal oscillator according to claim 2, wherein each of said first and second tuning fork arms is shaped as a square shaft.

4. The crystal oscillator according to claim 3, wherein said excitation electrode is arranged on each of four side surfaces of said first tuning arm, and the same potential is applied to each pair of opposite excitation electrodes that sandwich the first tuning fork arm.

5. The crystal oscillator according to claim 4, wherein two sensing electrodes are arranged on each side surface of one pair of opposite side surfaces of said second tuning fork arm, and the sensing electrodes of one side surface are arranged to confront the sensing electrodes on the other side surface with said second tuning fork arm interposed.

6. The crystal oscillator according to claim 2, wherein each of said tuning fork arms extends from said tuning fork arm is in a direction that is a crystallographic Y-axis direction of quartz, and each of said tuning fork arms has a displacement direction due to said tuning fork vibration that is in a crystallographic ±X-axis direction of the quartz.

7. The crystal oscillator according to claim 2, wherein the frequency of said clock signal is 32.768 KHz or 16.384 KHz.

8. The crystal oscillator according to claim 1, wherein the frequency of said clock signal is 32.768 KHz or 16.384 KHz.

* * * * *